United States Patent
Niwa et al.

(10) Patent No.: US 9,905,432 B2
(45) Date of Patent: Feb. 27, 2018

(54) SEMICONDUCTOR DEVICE, METHOD FOR MANUFACTURING THE SAME AND POWER CONVERTER

(71) Applicant: TOYODA GOSEI CO., LTD., Kiyosu-shi (JP)

(72) Inventors: Takaki Niwa, Kiyosu (JP); Tohru Oka, Kiyosu (JP); Masayoshi Kosaki, Kiyosu (JP); Takahiro Fujii, Kiyosu (JP); Yukihisa Ueno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/060,473

(22) Filed: Mar. 3, 2016

(65) Prior Publication Data
US 2016/0284563 A1    Sep. 29, 2016

(30) Foreign Application Priority Data

Mar. 24, 2015 (JP) ................. 2015-060424

(51) Int. Cl.
*H01L 21/324* (2006.01)
*H01L 29/66* (2006.01)
(Continued)

(52) U.S. Cl.
CPC .... *H01L 21/3245* (2013.01); *H01L 21/02107* (2013.01); *H01L 21/26553* (2013.01);
(Continued)

(58) Field of Classification Search
CPC ............. H01L 21/324; H01L 21/3245; H01L 21/26553
See application file for complete search history.

(56) References Cited

U.S. PATENT DOCUMENTS

| | | | |
|---|---|---|---|
| 2002/0055274 A1* | 5/2002 | Takeya | B82Y 20/00 438/796 |
| 2013/0045593 A1 | 2/2013 | Ooi | |

(Continued)

FOREIGN PATENT DOCUMENTS

| | | |
|---|---|---|
| JP | 2003-051613 A | 2/2003 |
| JP | 2004-128189 A | 4/2004 |

(Continued)

OTHER PUBLICATIONS

Japanese Notification of Reason For Rejection, dated Jan. 9, 2018, in Japanese Application No. 2015-060424 and English Translation thereof.

*Primary Examiner* — Amar Movva
(74) *Attorney, Agent, or Firm* — McGinn IP Law Group, PLLC.

(57) ABSTRACT

The method for manufacturing comprises an ion implantation process of implanting a p-type impurity into a semiconductor layer mainly made of a group III nitride by ion implantation; a first heating process of heating the semiconductor layer at a first temperature in a first atmospheric gas including ammonia ($NH_3$) after the ion implantation process; and a second heating process of heating the semiconductor layer, after the first heating process, at a second temperature that is lower than the first temperature in a second atmospheric gas including oxygen ($O_2$).

13 Claims, 16 Drawing Sheets

(51) Int. Cl.
*H01L 21/265* (2006.01)
*H01L 21/02* (2006.01)
*H01L 29/78* (2006.01)
*H01L 29/20* (2006.01)

(52) U.S. Cl.
CPC ...... *H01L 21/324* (2013.01); *H01L 29/66712* (2013.01); *H01L 29/7813* (2013.01); *H01L 29/2003* (2013.01)

(56) References Cited

U.S. PATENT DOCUMENTS

| | | |
|---|---|---|
| 2013/0146969 A1 | 6/2013 | Fujiwara et al. |
| 2014/0546801 | 2/2014 | Hashimoto et al. |

FOREIGN PATENT DOCUMENTS

| | | |
|---|---|---|
| JP | 2004-356257 A | 12/2004 |
| JP | 2008-135700 A | 6/2008 |
| JP | 2008-205315 A | 9/2008 |
| JP | 2009-170604 A | 7/2009 |
| JP | 2010-016105 A | 1/2010 |
| JP | 2013-042050 A | 2/2013 |
| JP | 2013-125763 A | 6/2013 |
| JP | 2014-041917 A | 3/2014 |
| JP | 2014-183146 A | 9/2014 |
| JP | 2014-225506 A | 12/2014 |

* cited by examiner

US 9,905,432 B2

SEMICONDUCTOR DEVICE, METHOD FOR MANUFACTURING THE SAME AND POWER CONVERTER

CROSS REFERENCE TO RELATED APPLICATION

The present application claims the priority based on Japanese Patent Application No. 2015-60424 filed on Mar. 24, 2015, the disclosures of which are hereby incorporated by reference in its entirety.

BACKGROUND

Technical Field

The present invention relates to a semiconductor device, a method for manufacturing the same and a power converter Description of the Related Art As is generally known, in the process of manufacturing a semiconductor device (semiconductor element) using a group III nitride such as gallium nitride (GaN), it is difficult to form a group III nitride-based p-type semiconductor by ion implantation.

JP 2008-205315A and JP 2008-135700A disclose a technique of implanting a p-type impurity into a group III nitride-based semiconductor layer by ion implantation and subsequently heating the semiconductor layer in an atmospheric gas including nitrogen ($N_2$).

JP 2009-170604A discloses a technique of implanting a p-type impurity into a group III nitride-based semiconductor layer by ion implantation and subsequently heating the semiconductor layer in an atmospheric gas including ammonia ($NH_3$).

JP 2014-41917A discloses a technique of implanting a p-type impurity into a group III nitride-based semiconductor layer by ion implantation and subsequently heating the semiconductor layer in an atmospheric gas having varying flow rates of a reducing gas (for example, hydrogen ($H_2$) and a nitrogen source gas (for example, ammonia ($NH_3$)).

The techniques disclosed in JP 2008-205315A, JP 2008-135700A, JP 2009-170604A and JP 2014-41917A, however, have a problem that the area of the group III nitride-based semiconductor layer in which the p-type impurity is implanted is not effectively activated as the p-type semiconductor. There is accordingly a need for a technique that enables a group III nitride-based p-type semiconductor to be effectively formed by ion implantation. Other needs with regard to the semiconductor device include cost reduction, miniaturization, easy manufacture, resource saving, improvement of usability and improvement of durability.

SUMMARY

In order to solve at least part of the problems described above, the invention may be implemented by aspects described below.

(1) According to one aspect of the invention, a method for manufacturing a semiconductor device is provided. The method for manufacturing the semiconductor device of this aspect includes: an ion implantation process of implanting a p-type impurity into a semiconductor layer mainly made of a group III nitride by ion implantation; a first heating process of heating the semiconductor layer at a first temperature in a first atmospheric gas including ammonia ($NH_3$), after the ion implantation process; and a second heating process of heating the semiconductor layer, after the first heating process, at a second temperature that is lower than the first temperature in a second atmospheric gas including oxygen ($O_2$). This aspect accelerates diffusion of the p-type impurity into the semiconductor layer in the first heating process and subsequently accelerates fixation of the p-type impurity into the semiconductor layer in the second heating process. This enables the group III nitride-based p-type semiconductor to be effectively formed by ion implantation.

(2) In the method for manufacturing the semiconductor device according to the above aspect, the second atmospheric gas may include nitrogen ($N_2$) and oxygen ($O_2$). This aspect further accelerates fixation of the p-type impurity in the semiconductor layer in the second heating process. Nitrogen ($N_2$) suppresses release of nitrogen atom (N) from the surface of the semiconductor layer and thereby suppresses the occurrence of n-type carrier (free electron). This accordingly enables the group III nitride-based p-type semiconductor to be more effectively formed by ion implantation.

(3) In the method for manufacturing the semiconductor device according to the above aspect, the second temperature may be not lower than 500° C. and not higher than 800° C. This aspect sufficiently accelerates fixation of the p-type impurity into the semiconductor layer in the second heating process.

(4) In the method for manufacturing the semiconductor device according to the above aspect, the first temperature may be not lower than 900° C. and not higher than 1400° C. This aspect sufficiently accelerates diffusion of the p-type impurity into the semiconductor layer in the first heating process.

(5) In the method for manufacturing the semiconductor device according to the above aspect, the ion implantation process may implant at least one of magnesium atom (Mg) and beryllium atom (Be) as the p-type impurity into the semiconductor layer by ion implantation. This aspect enables the group III nitride-based p-type semiconductor containing at least one of magnesium atom (Mg) and beryllium atom (Be) as the p-type impurity to be effectively formed by ion implantation.

(6) In the method for manufacturing the semiconductor device according to the above aspect, the ion implantation process may implant oxygen atom (O) simultaneously with the p-type impurity into the semiconductor layer by ion implantation. This aspect further accelerates diffusion of the p-type impurity into the semiconductor layer in the first heating process and further accelerates fixation of the p-type impurity in the semiconductor layer in the second heating process.

(7) In the method for manufacturing the semiconductor device according to the above aspect, the first atmospheric gas may include ammonia ($NH_3$) and nitrogen ($N_2$). In this aspect, nitrogen ($N_2$) suppresses release of nitrogen atom (N) from the surface of the semiconductor layer and thereby suppresses the occurrence of n-type carrier (free electron). This accordingly enables the group III nitride-based p-type semiconductor to be more effectively formed by ion implantation.

(8) In the method for manufacturing the semiconductor device according to the above aspect, the first atmospheric gas may include ammonia ($NH_3$) and hydrogen ($H_2$). This aspect further accelerates diffusion of the p-type impurity in the semiconductor layer in the first heating process.

(9) In the method for manufacturing the semiconductor device according to the above aspect, the first heating process may heat the semiconductor layer after implantation of the p-type impurity at the first temperature in the first atmospheric gas for a time period that is not shorter than 1 minute and not longer than 30 minutes. This aspect sufficiently accelerates diffusion of the p-type impurity in the semiconductor layer in the first heating process.

(10) In the method for manufacturing the semiconductor device according to the above aspect, the second heating process may heat the semiconductor layer after the first heating process at the second temperature in the second atmospheric gas for a time period that is not shorter than 1 minute and not longer than 15 minutes. This aspect sufficiently accelerates fixation of the p-type impurity in the semiconductor layer in the second heating process.

(11) The method for manufacturing the semiconductor device according to the above aspect may further comprise a process of forming a through insulating film on the semiconductor layer, prior to the ion implantation process. The ion implantation process may implant the p-type impurity across the through insulating film into the semiconductor layer by ion implantation. In this aspect, the through insulating film serves to adjust the distribution of the p-type impurity implanted into the semiconductor layer. The through insulating film also serves to suppress surface contamination of the semiconductor layer by ion implantation.

(12) The method for manufacturing the semiconductor device according to the above aspect may repeat a series of the first heating process and the subsequent second heating process multiple number of times. This aspect enables the group III nitride-based p-type semiconductor to be more effectively formed by ion implantation.

(13) The method for manufacturing the semiconductor device according to the above aspect may further comprise a process of forming a p-type semiconductor layer on the semiconductor layer by crystal growth, prior to the ion implantation process. The ion implantation process may implant the p-type impurity through the p-type semiconductor layer into the semiconductor layer by ion implantation. Compared with a method of forming the p-type semiconductor layer on the semiconductor layer by regrowth after ion implantation, this aspect prevents a potential trouble caused by contamination of the n-type impurity into the regrowth interface of the p-type semiconductor layer. This also reduces a contact resistance between the p-type semiconductor area by ion implantation and the p-type semiconductor layer by crystal growth.

(14) According to another aspect of the invention, a semiconductor device is provided. The semiconductor device of this aspect includes: an n-type semiconductor layer that contains an n-type impurity; and a p-type semiconductor area that is formed in part of the n-type semiconductor layer by ion implantation and contains a p-type impurity, wherein the p-type semiconductor area has concentration of the p-type impurity higher than concentration of the n-type impurity, and concentration of hydrogen atom (H) lower than the concentration of the p-type impurity. In the semiconductor device of this aspect, the p-type semiconductor area formed by ion implantation serves as the p-type semiconductor.

(15) In the semiconductor device of the above aspect, the concentration of the p-type impurity in the p-type semiconductor area may be not less than 100 times the concentration of the n-type impurity. This aspect enables the p-type semiconductor area formed by ion implantation to serve as the p-type semiconductor.

(16) In the semiconductor device of the above aspect, the concentration of hydrogen atom (H) in the p-type semiconductor area may be not higher than $2\times10^{17}$ $cm^{-3}$. This aspect enables the p-type semiconductor area formed by ion implantation to serve as the p-type semiconductor.

The invention may be implemented by any of various aspects other than the semiconductor device and the method for manufacturing the semiconductor device. For example, the invention may be implemented by a power converter comprising the semiconductor device of any of the above aspects, electric equipment in which the semiconductor device of any of the above aspects is incorporated and a manufacturing apparatus for manufacturing the semiconductor device of any of the above aspects.

The above aspect of the invention accelerates diffusion of the p-type impurity into the semiconductor layer in the first heating process and subsequently accelerates fixation of the p-type impurity in the semiconductor layer in the second heating process. This enables the group III nitride-based p-type semiconductor to be effectively formed by ion implantation.

DESCRIPTION OF EMBODIMENTS

A. First Embodiment

A-1. Configuration of Power Converter

Figure 1:
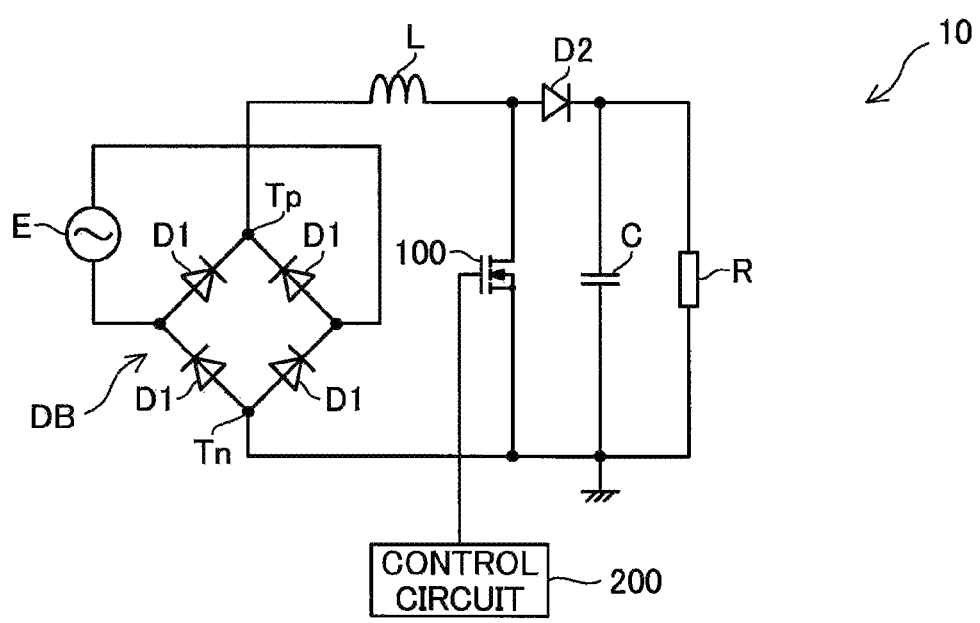
FIG. 1 is a diagram illustrating the configuration of a power converter.

FIG. 1 is a diagram illustrating the configuration of a power converter 10. The power converter 10 is an apparatus configured to convert electric power supplied from an AC power source E to a load R. The power converter 10 includes a semiconductor device 100, a control circuit 200, four diodes D1, a coil L, a diode D2 and a capacitor C as components of a power factor correction circuit configured to improve the power factor of the AC power source E.

In the power converter 10, the four diodes D1 constitute a diode bride DB configured to rectify the AC voltage of the AC power source E. The diode bridge DB has a positive electrode output terminal Tp and a negative electrode output terminal Tn as DC-side terminals. The coil L is connected with the positive electrode output terminal Tp of the diode bridge DB. The anode side of the diode D2 is connected with the positive electrode output terminal Tp via the coil L. The cathode side of the diode D2 is connected with the negative electrode output terminal Tn via the capacitor C. The load R is connected in parallel with the capacitor C.

The semiconductor device 100 of the power converter 10 is an FET (field effect transistor). The source side of the semiconductor device 100 is connected with the negative electrode output terminal Tn. The drain side of the semiconductor device 100 is connected with the positive electrode output terminal Tp via the coil L. The gate side of the semiconductor device 100 is connected with the control circuit 200. The control circuit 200 of the power converter 10 controls the electric current between the source and the drain of the semiconductor device 100, based on the voltage output to the load R and the electric current flowing in the diode bridge DB, in order to improve the power factor of the AC power source E.

A-2. Configuration of Semiconductor Device

Figure 2:
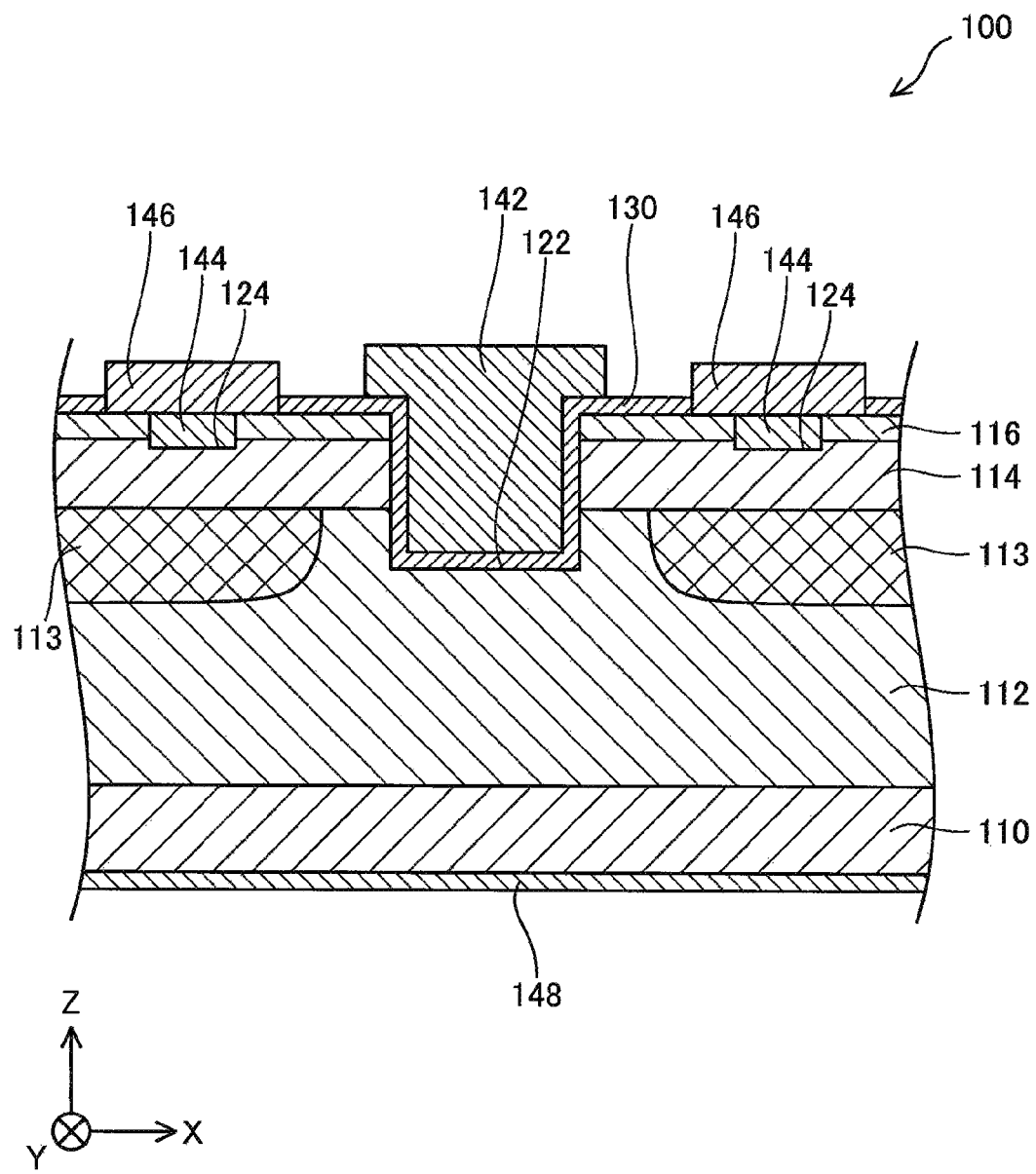
FIG. 2 is a sectional view schematically illustrating the configuration of the semiconductor device according to a first embodiment.

FIG. 2 is a sectional view schematically illustrating the configuration of the semiconductor device 100 according to a first embodiment. XYZ axes orthogonal to one another are illustrated in FIG. 2. Among the XYZ axes of FIG. 2, the X axis denotes a left-right axis on the sheet surface of FIG. 2. +X-axis direction denotes a rightward direction on the sheet surface, and −X-axis direction denotes a leftward direction on the sheet surface. Among the XYZ axes of FIG. 2, the Y axis denotes a front-back axis on the sheet surface of FIG. 2. +Y-axis direction denotes a backward direction on the sheet surface, and −Y-axis direction denotes a forward direction on the sheet surface. Among the XYZ axes of FIG. 2, the Z axis denotes a top-bottom axis on the sheet surface of FIG. 2. +Z-axis direction denotes an upward direction on the sheet surface, and −Z-axis direction denotes a downward direction on the sheet surface. The XYZ axes illustrated in other drawings correspond to the XYZ axes of FIG. 2.

According to this embodiment, the semiconductor device 100 is a GaN-based semiconductor device formed using gallium nitride (GaN). According to this embodiment, the semiconductor device 100 is a vertical trench MOSFET (metal-oxide-semiconductor field effect transistor). According to this embodiment, the semiconductor device 100 is used for power control and is also called power device.

The semiconductor device 100 includes a substrate 110, an n-type semiconductor layer 112, a p-type semiconductor area 113, a p-type semiconductor layer 114 and an n-type semiconductor layer 116. The semiconductor device 100 includes a trench 122 and a recess 124 as structures formed in these semiconductor layers. The semiconductor device 100 also includes an insulating film 130, a gate electrode 142, a body electrode 144, a source electrode 146 and a drain electrode 148.

The substrate 110 of the semiconductor device 100 is a plate-like semiconductor extended along the X axis and the Y axis. According to this embodiment, the substrate 110 is mainly made of gallium nitride (GaN). In the description hereof, the expression of "mainly made of gallium nitride (GaN)" means "containing gallium nitride (GaN) at 90% or a higher molar fraction. According to this embodiment, the substrate 110 is an n-type semiconductor containing silicon (Si) as the donor element. According to this embodiment, the average concentration of silicon (Si) contained in the substrate 110 is about $1\times10^{18}$ $cm^{-3}$.

The n-type semiconductor layer 112 of the semiconductor device 100 is a semiconductor having n-type characteristics. According to this embodiment, the n-type semiconductor layer 112 is located on the +Z-axis direction side of the substrate 110 and is extended along the X axis and the Y axis. According to this embodiment, the n-type semiconductor layer 112 is mainly made of gallium nitride (GaN). According to this embodiment, the n-type semiconductor layer 112 contains silicon (Si) as the donor element (n-type impurity). According to this embodiment, the average concentration of silicon (Si) contained in the n-type semiconductor layer 112 is not higher than about $1\times10^{17}$ $cm^{-3}$ and is, for example, $1\times10^{16}$ $cm^{-3}$. According to this embodiment, the thickness (length in the Z-axis direction) of the n-type semiconductor layer 112 is not greater than 20 μm (micrometers), is preferably not greater than 15 μm, and is, for example, 10 μm.

The p-type semiconductor area 113 of the semiconductor device 100 is an area formed by ion implantation into part of the n-type semiconductor layer 112. The semiconductor of the p-type semiconductor area 113 mainly has p-type characteristics. According to this embodiment, the p-type semiconductor area 113 is formed in a location away from the trench 122 to be adjacent to the n-type semiconductor layer 112 and the p-type semiconductor layer 114. According to this embodiment, the p-type semiconductor area 113 is mainly made of gallium nitride (GaN), like the n-type semiconductor 112. According to this embodiment, the p-type semiconductor area 113 contains magnesium (Mg) as the acceptor element (p-type impurity). The p-type semiconductor area 113 has the higher concentration of the p-type impurity than the concentration of the n-type impurity and the lower concentration of hydrogen atom (H) than the concentration of the p-type impurity. According to this embodiment, the concentration of the p-type impurity is not lower than 100 times the concentration of the n-type impurity in the p-type semiconductor area 113. According to this embodiment, the concentration of hydrogen atom (H) in the p-type semiconductor area 113 is not higher than $2\times10^{17}$ $cm^{-3}$.

The p-type semiconductor layer 114 of the semiconductor device 100 is a semiconductor having p-type characteristics. According to this embodiment, the p-type semiconductor layer 114 is located on the +Z-axis direction side of the n-type semiconductor layer 112 and the p-type semiconductor area 113 and is extended along the X axis and the Y axis. According to this embodiment, the p-type semiconductor layer 114 is mainly made of gallium nitride (GaN). According to this embodiment, the p-type semiconductor layer 114 contains magnesium (Mg) as the acceptor element. According to this embodiment, the average concentration of magnesium (Mg) contained in the p-type semiconductor layer 114 is about $4\times10^{18}$ cm$^{-3}$. According to this embodiment, the thickness (length in the Z-axis direction) of the p-type semiconductor layer 114 is about 1.0 μm.

The n-type semiconductor layer 116 of the semiconductor device 100 is a semiconductor having n-type characteristics. According to this embodiment, the n-type semiconductor layer 116 is located on the +Z-axis direction side of the p-type semiconductor layer 114 and is extended along the X axis and the Y axis. According to this embodiment, the n-type semiconductor layer 116 is mainly made of gallium nitride (GaN). According to this embodiment, the n-type semiconductor layer 116 contains silicon (Si) as the donor element. According to this embodiment, the average concentration of silicon (Si) contained in the n-type semiconductor layer 116 is about $3\times10^{18}$ cm$^{-3}$. According to this embodiment, the thickness (length in the Z-axis direction) of the n-type semiconductor layer 116 is about 0.2 μm.

The trench 122 of the semiconductor device 100 is a groove formed from the +Z-axis direction side of the n-type semiconductor layer 116 to penetrate through the p-type semiconductor layer 114 and to be recessed into the n-type semiconductor layer 112. According to this embodiment, the trench 122 is a structure formed by dry etching of the respective semiconductor layers.

The recess 124 of the semiconductor device 100 is a concave recessed from the +Z-axis direction side of the n-type semiconductor layer 116 into the p-type semiconductor layer 114. According to this embodiment, the recess 124 is a structure formed by dry etching of the respective semiconductor layers.

The insulating film 130 of the semiconductor device 100 is a film that is formed inside of the trench 122 and has electrical insulating properties. According to this embodiment, the insulating film 130 is formed from inside to outside of the trench 122. According to this embodiment, the insulating film 130 is mainly made of silicon dioxide (SiO$_2$).

The gate electrode 142 of the semiconductor device 100 is an electrode that is formed inside of the trench 122 via the insulating film 130. According to this embodiment, the gate electrode 142 is formed from inside to outside of the trench 122. According to this embodiment, the gate electrode 142 is mainly made of aluminum (Al). When a voltage is applied to the gate electrode 142, an inversion layer is formed in the p-type semiconductor layer 114 to serve as a channel, and a conductive path is formed between the source electrode 146 and the drain electrode 148.

The body electrode 144 of the semiconductor device 100 is an electrode that is formed in the recess 124 and is in ohmic contact with the p-type semiconductor layer 114. According to this embodiment, the body electrode 144 is an electrode obtained by stacking a layer mainly made of palladium (Pd) and subsequently processing the stacked layer by heat treatment.

The source electrode 146 of the semiconductor device 100 is an electrode that is in ohmic contact with the n-type semiconductor layer 116. According to this embodiment, the source electrode 146 is formed from top of the body electrode 144 onto a +Z-axis direction side surface of the n-type semiconductor layer 116. According to another embodiment, the source electrode 146 may be formed in a location away from the body electrode 144. According to this embodiment, the source electrode 146 is an electrode obtained by stacking a layer mainly made of aluminum (Al) on a layer mainly made of titanium (Ti) and subsequently processing the stacked layers by heat treatment.

The drain electrode 148 of the semiconductor device 100 is an electrode that is in ohmic contact with a −Z-axis direction side surface of the substrate 110. According to this embodiment, the drain electrode 148 is an electrode obtained by stacking a layer mainly made of aluminum (Al) on a layer mainly made of titanium (Ti) and subsequently processing the stacked layers by heat treatment.

A-3. Method for Manufacturing Semiconductor Device

Figure 3:
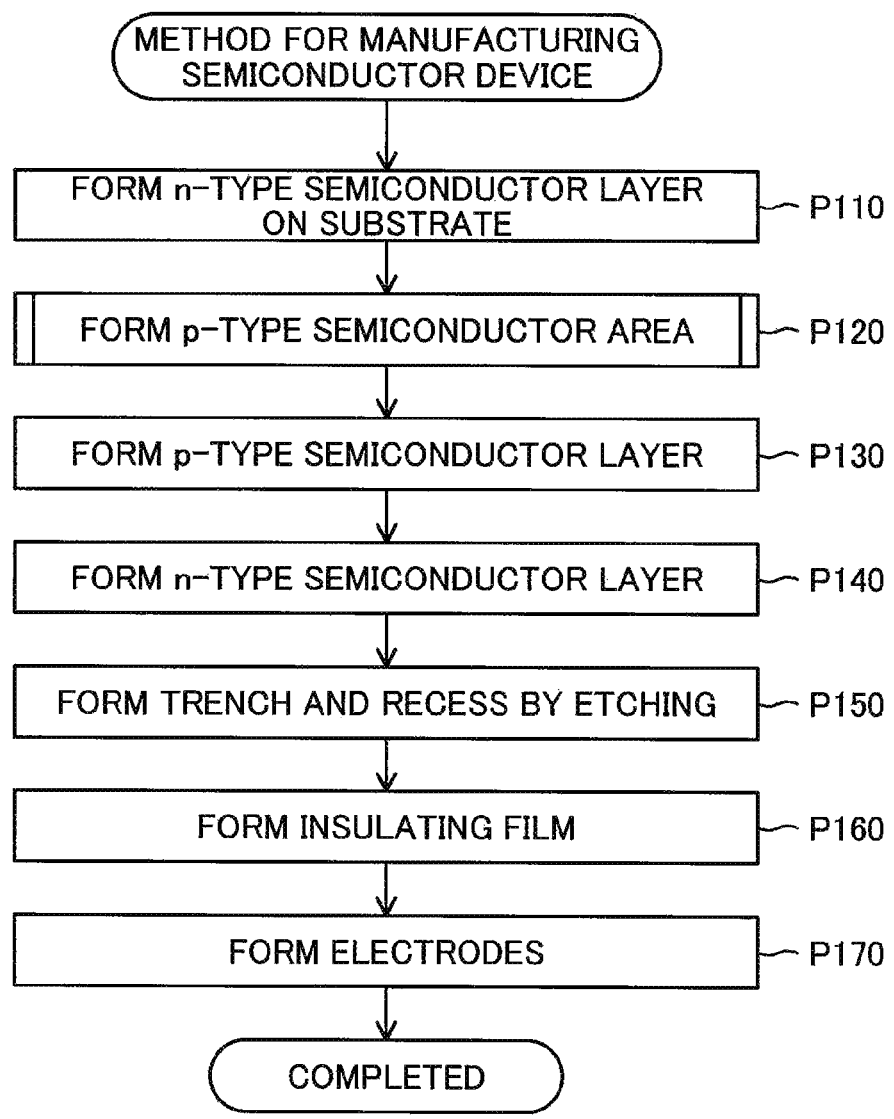
FIG. 3 is a process chart showing a method for manufacturing the semiconductor device according to the first embodiment.

FIG. 3 is a process chart showing a method for manufacturing the semiconductor device 100 according to the first embodiment. The manufacturer first forms the n-type semiconductor layer 112 on the substrate 110 by crystal growth (process P110). According to this embodiment, the manufacturer forms the n-type semiconductor layer 112 on a +Z-axis direction side surface of the substrate 110. According to this embodiment, the manufacturer forms the n-type semiconductor layer 112 by metal organic chemical vapor deposition (MOCVD).

After forming the n-type semiconductor layer 112 (process P110), the manufacturer forms the p-type semiconductor area 113 in part of the n-type semiconductor layer 112 by ion implantation (process P120). According to this embodiment, the manufacturer forms the p-type semiconductor area 113 on part of the +Z-axis direction side of the n-type semiconductor layer 112.

Figure 4:
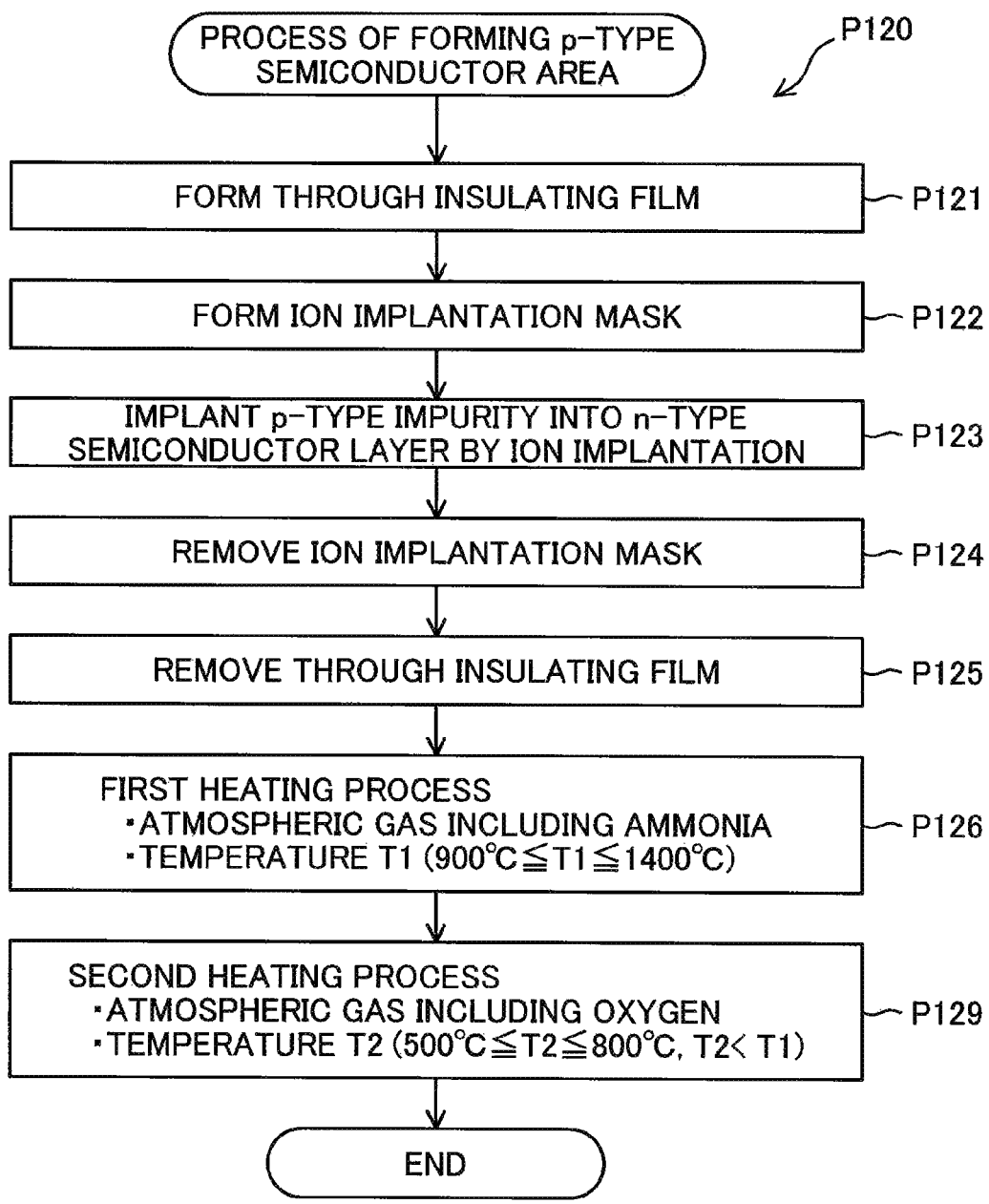
FIG. 4 is a process chart showing the process of forming the p-type semiconductor area according to the first embodiment.

FIG. 4 is a process chart showing the process of forming the p-type semiconductor area 113 (process P120) according to the first embodiment. FIGS. 5, 6, 7, 8 and 9 are diagrams illustrating the processes of forming the p-type semiconductor area 113.

Figure 5:
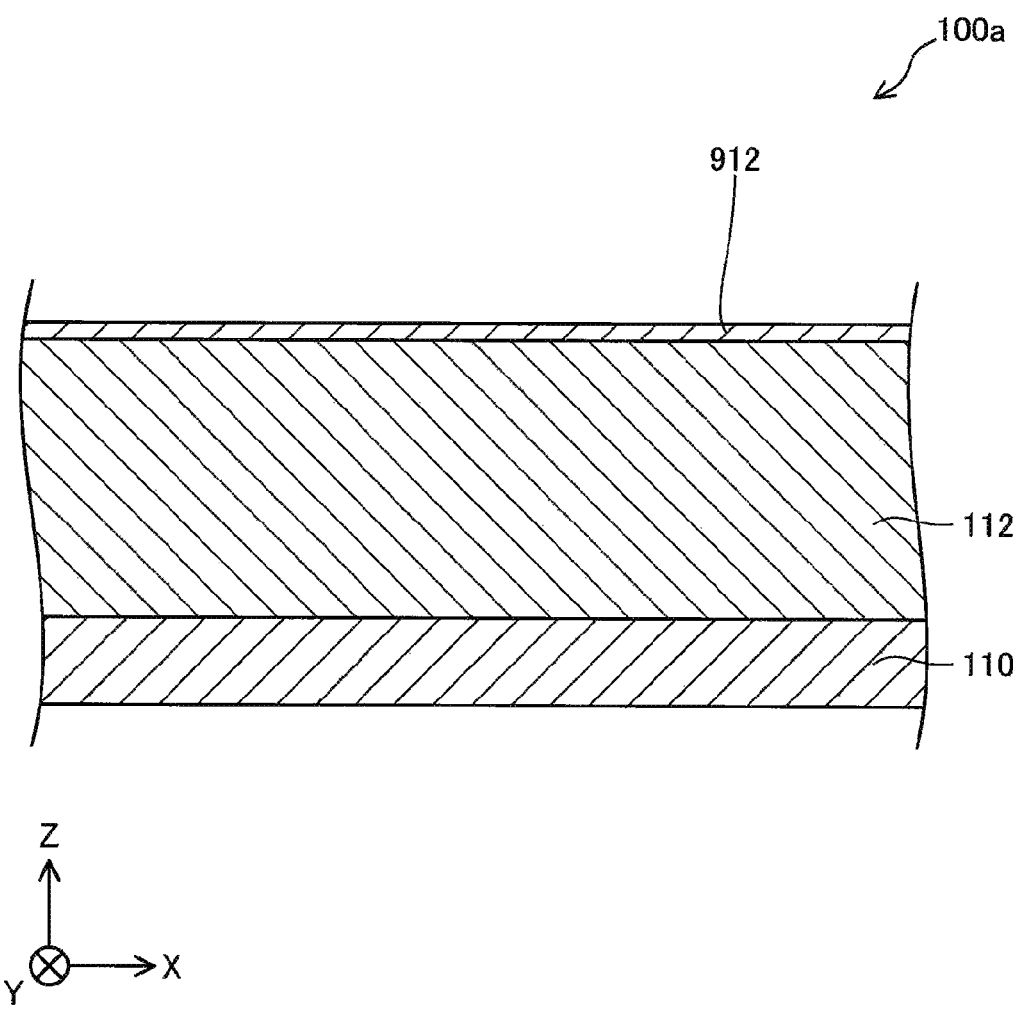
FIG. 5 is a diagram illustrating the processes of forming the p-type semiconductor area.

In the process of forming the p-type semiconductor area 113 (process P120), the manufacturer forms a through insulating film 912 on a +Z-axis direction side surface of the n-type semiconductor layer 112 (process P121, FIG. 5). The manufacturer accordingly obtains a semiconductor device 100a including the through insulating film 912 as an intermediate product of the semiconductor device 100. According to this embodiment, the manufacturer forms the through insulating film 912 by sputtering. According to this embodiment, the through insulating film 912 is mainly made of silicon dioxide (SiO$_2$). According to this embodiment, the through insulating film 912 has thickness of about 30 nm (nanometers). The through insulating film 912 serves as a dummy layer to adjust the concentration of the p-type impurity implanted on the surface side of the n-type semiconductor layer 112 by ion implantation in a downstream process and serves to suppress surface contamination of the n-type semiconductor layer 112 by ion implantation. According to another embodiment, the manufacturer may not form the through insulating film 912.

Figure 6:
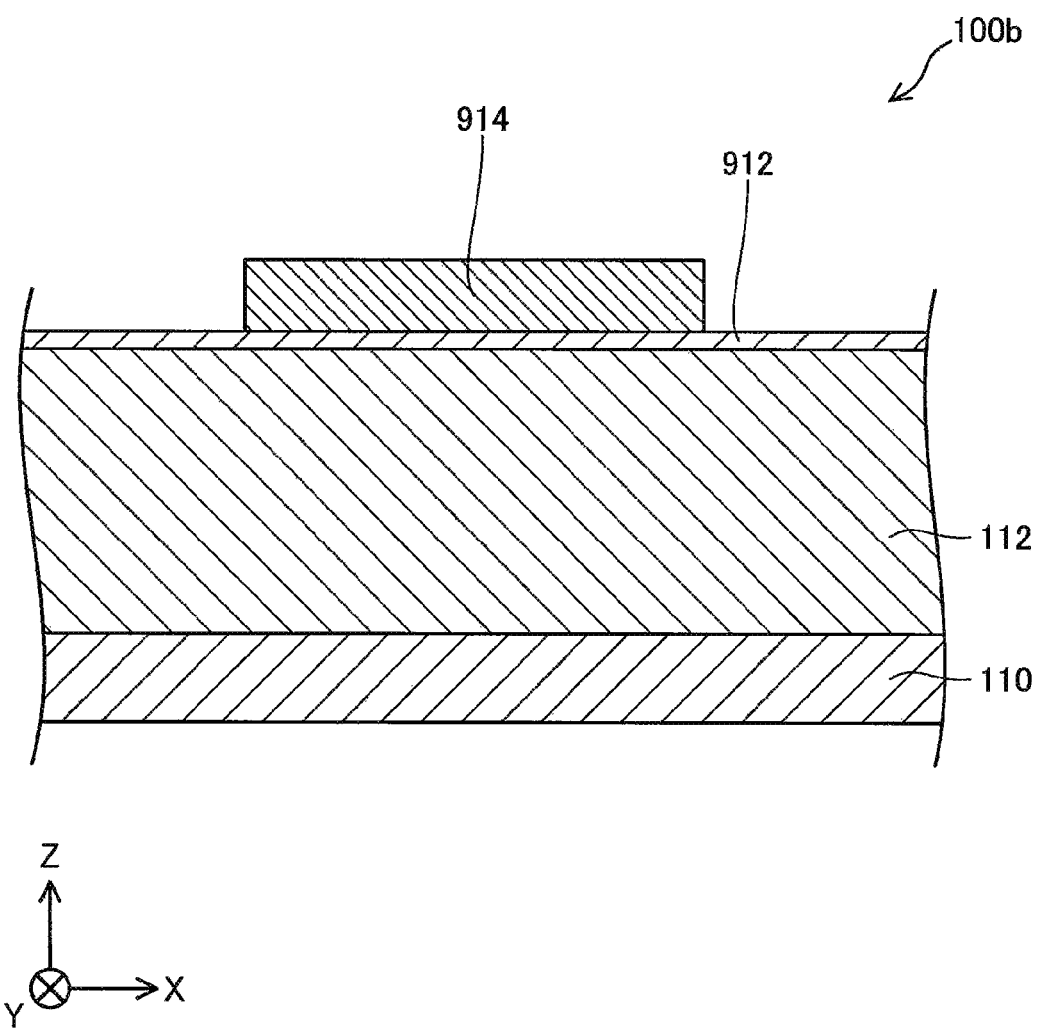
FIG. 6 is a diagram illustrating the processes of forming the p-type semiconductor area.

After forming the through insulating film 912 (process P121), the manufacturer forms an ion implantation mask 914 (process P122, FIG. 6). According to this embodiment, the manufacturer forms the ion implantation mask 914 on the through insulating film 912. The manufacturer accordingly obtains a semiconductor device 100b including the ion implantation mask 914 as an intermediate product of the semiconductor device 100. According to this embodiment, the manufacturer forms a film by sputtering or metal organic chemical vapor deposition (MOCVD) and subsequently etches out an unrequired part by lithography to form the ion implantation mask 914. According to this embodiment, the ion implantation mask 914 is mainly made of aluminum nitride (AlN). As long as the ion implantation mask 914 is configured to partly interfere with implantation of the p-type impurity by ion implantation, the ion implantation mask 914 may be a photoresist or may be an insulating film according to another embodiment. According to another embodiment, in the case where the through insulating film 912 is not formed, the manufacturer may form the ion implantation mask 914 directly on the n-type semiconductor layer 112.

Figure 7:
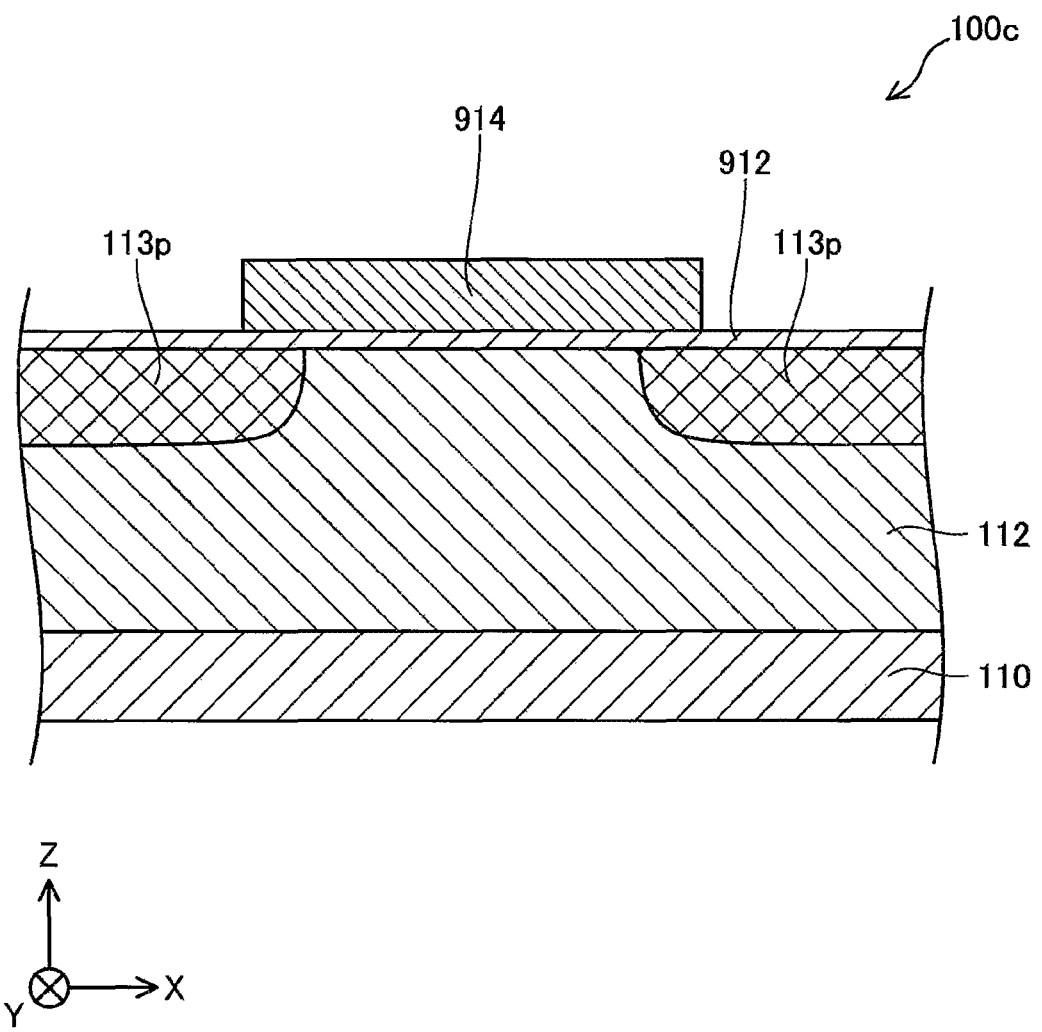
FIG. 7 is a diagram illustrating the processes of forming the p-type semiconductor area.

After forming the ion implantation mask 914 (process P122), the manufacturer implants the p-type impurity into the n-type semiconductor layer 112 by ion implantation (process P123, FIG. 7). According to this embodiment, the manufacturer implants the p-type impurity from the +Z-axis direction side across the through insulating film 912 into the n-type semiconductor layer 112. This forms a p-type implantation area 113p as the area in which the p-type impurity is implanted, in part of the +Z-axis direction side of the n-type semiconductor layer 112. The manufacturer accordingly obtains a semiconductor device 100c including the p-type implantation area 113p formed below the through insulating film 912 as an intermediate product of the semiconductor device 100.

According to this embodiment, the p-type impurity is magnesium atom (Mg). According to another embodiment, the p-type impurity may be beryllium atom (Be). According to another embodiment, the manufacturer may implant oxygen atom (O) simultaneously with the p-type impurity into the n-type semiconductor layer 112 by ion implantation. This further accelerates diffusion and fixation of the p-type impurity in the n-type semiconductor layer 112 in a downstream heating process.

After forming the p-type impurity (process P123), the manufacturer removes the ion implantation mask 914 from the semiconductor device 100c (process P124). According to this embodiment, the manufacturer removes the ion implantation mask 914 by etching.

Figure 8:
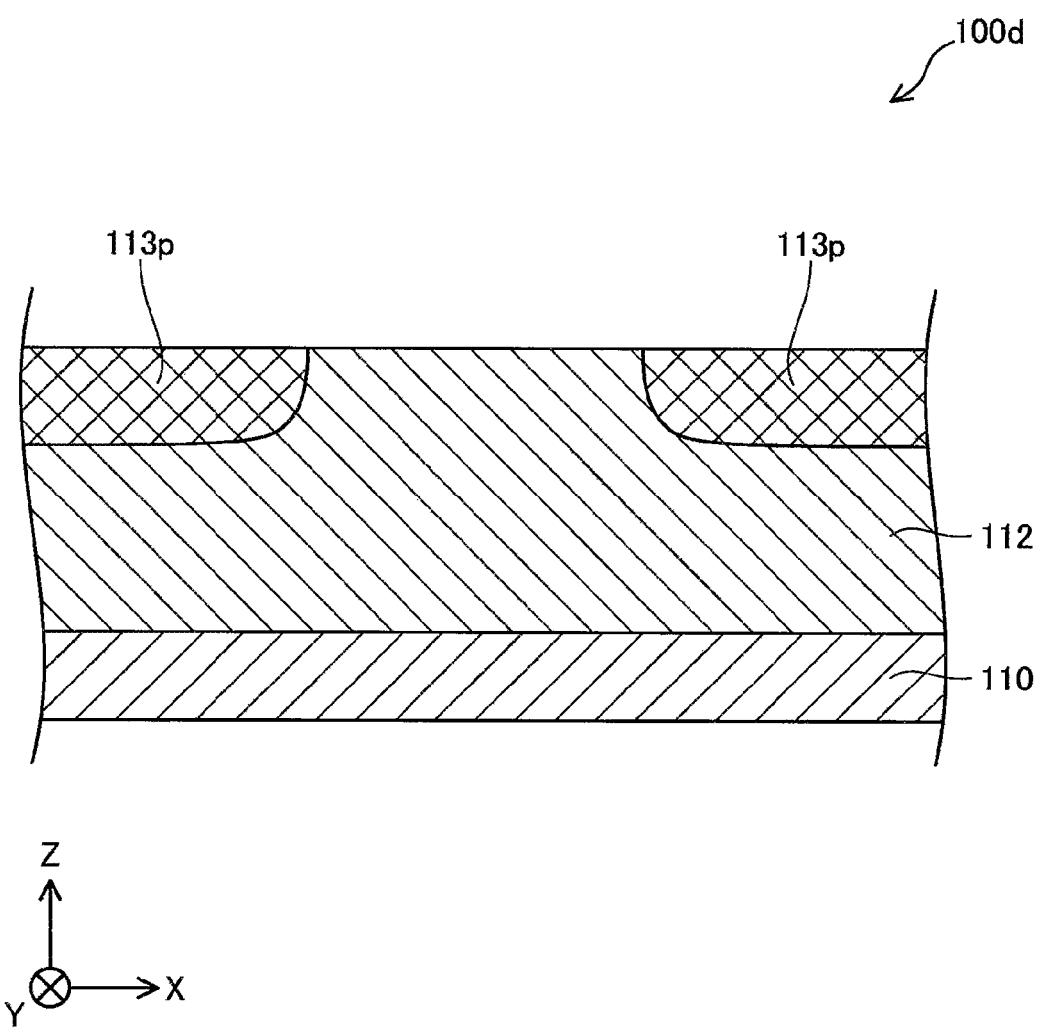
FIG. 8 is a diagram illustrating the processes of forming the p-type semiconductor area.
Figure 9:
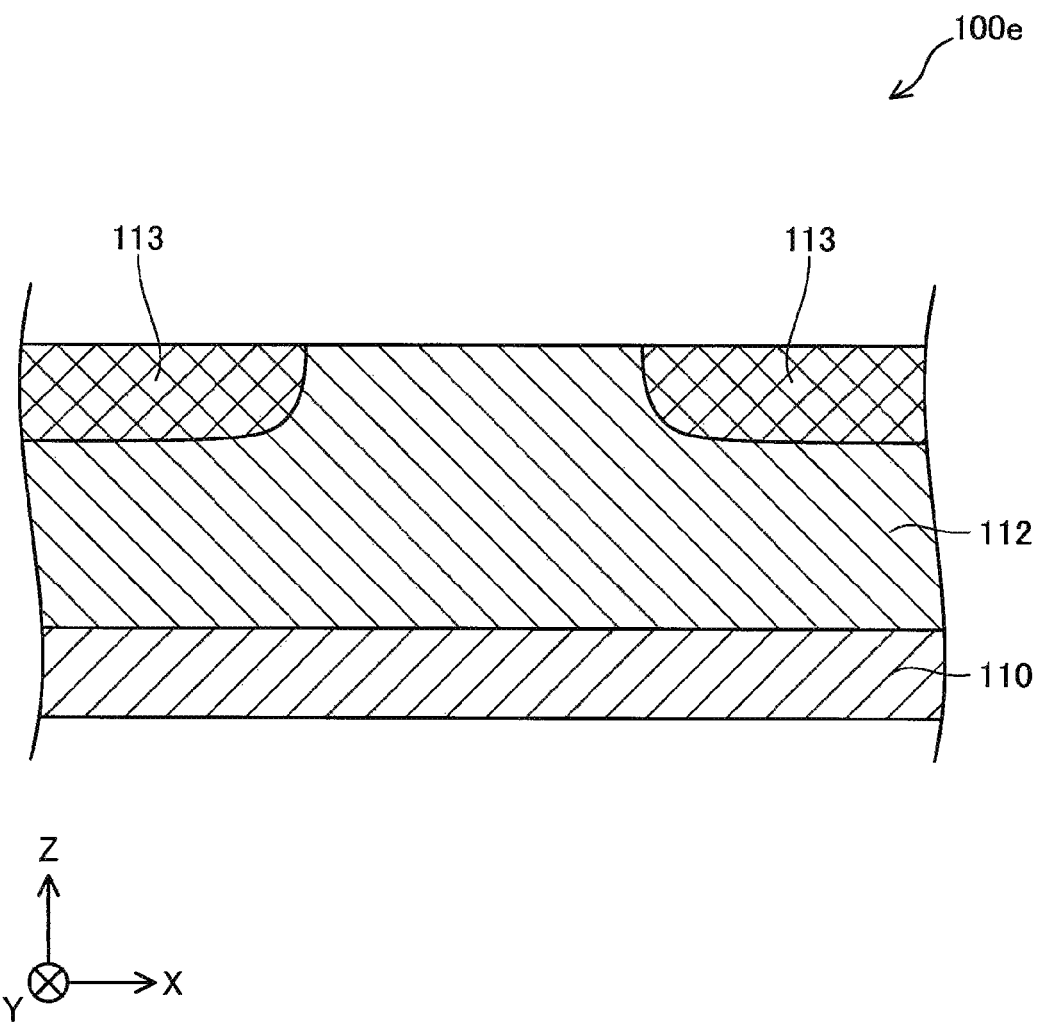
FIG. 9 is a diagram illustrating the processes of forming the p-type semiconductor area.

After removing the ion implantation mask 914 (process P124), the manufacturer subsequently removes the through insulating film 912 (process P125, FIG. 8). According to this embodiment, the manufacturer removes the through insulating film 912 by etching. The manufacturer accordingly obtains a semiconductor device 100d including the p-type implantation area 113p formed in part of the n-type semiconductor layer 112 as an intermediate product of the semiconductor device 100.

After removing the through insulating film 912 (process P125), the manufacturer processes the semiconductor device 100d by a first heating process (process P126). In the first heating process (process P126), the manufacturer heats the semiconductor device 100d at a first temperature T1 in a first atmospheric gas including ammonia ($NH_3$). According to this embodiment, the manufacturer supplies ammonia ($NH_3$) at a flow rate of 30 slm into a furnace where the semiconductor device 100d is placed, so as to form the first atmospheric gas around the semiconductor device 100d. The manufacturer subsequently heats the semiconductor device 100d at the first temperature T1 set to 1050° C. in the first atmospheric gas. The manufacturer then keeps the semiconductor device 100d at the first temperature T1 for 10 minutes.

Figure 10:
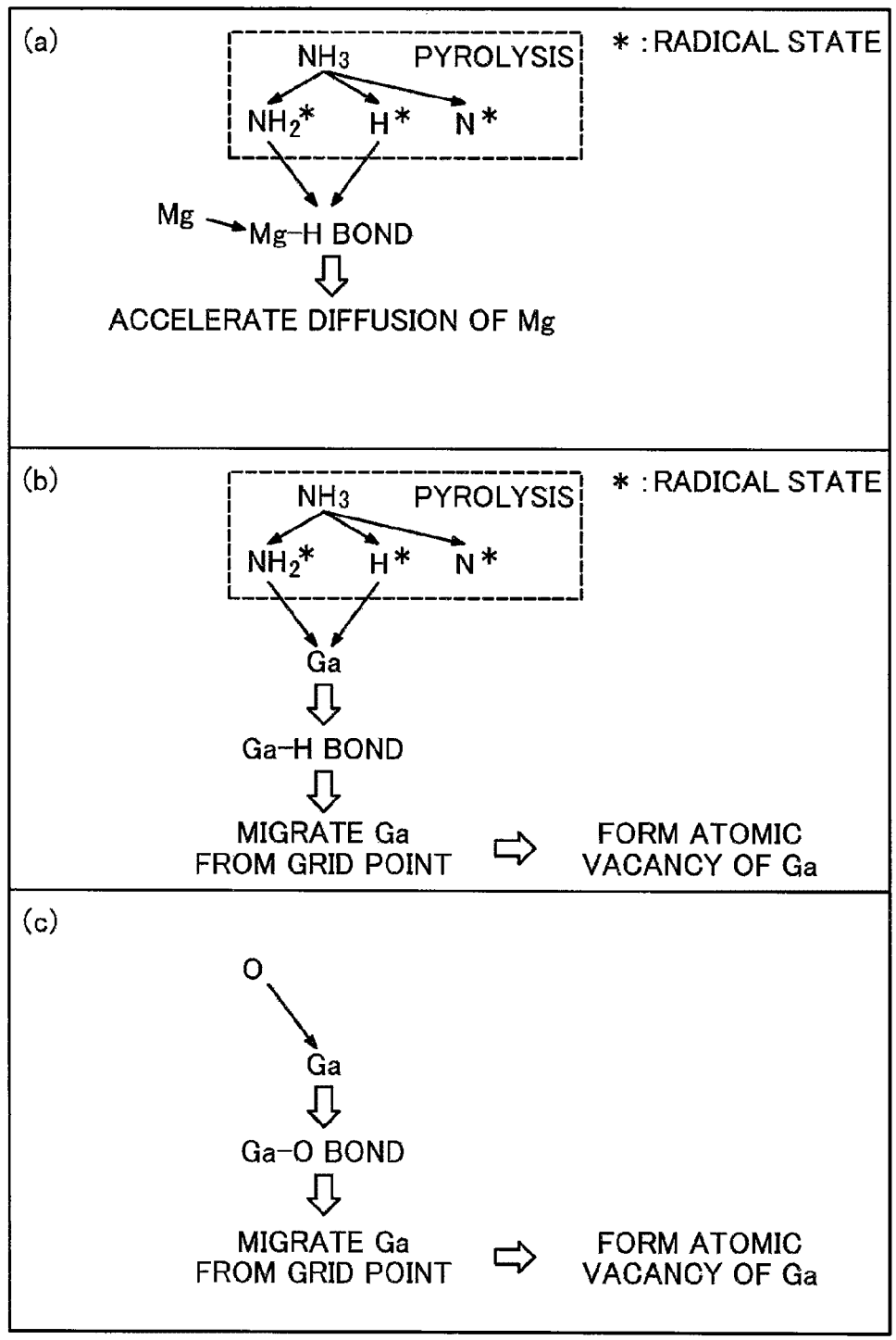
FIG. 10 is a diagram illustrating reactions proceeding in the p-type implantation area in the first heating process.

FIG. 10 is a diagram illustrating reactions proceeding in the p-type implantation area 113p in the first heating process (process P126). As shown in FIG. 10(a), in the first heating process (process P126), ammonia ($NH_3$) included in the first atmospheric gas is pyrolyzed on the surface of the p-type implantation area 113p. This produces $NH_2$ radical and H radical. Part of the $NH_2$ radical is further pyrolyzed to produce N radical. The $NH_2$ radical and the H radical produced from the first atmospheric gas react with magnesium atom (Mg) that is present in the p-type implantation area 113p. This forms Mg—H bond (protonation reaction). Magnesium atom (Mg) forming the Mg—H bond is more likely to migrate in the p-type implantation area 113p.

As shown in FIG. 10(b), the $NH_2$ radical and the H radical produced from the first atmospheric gas also react with gallium atom (Ga) that is present inside of the p-type implantation area 113p. This forms Ga—H bond (protonation reaction). Gallium atom (Ga) forming the Ga—H bond is more likely to migrate in the p-type implantation area 113p. This increases the likelihood that gallium atom (Ga) migrates from the grid point to form a vacancy in the p-type implantation area 113p.

The reactions of FIGS. 10(a) and 10(b) make magnesium atom (Mg) more likely to enter the grid point of gallium atom (Ga). This results in accelerating diffusion of magnesium atom (Mg) into the p-type implantation area 113p.

In the case where oxygen atom (O) is implanted simultaneously with the p-type impurity into the n-type semiconductor layer 112 by ion implantation, oxygen atom (O) is also present in the p-type implantation area 113p. This oxygen atom (O) reacts with gallium atom (Ga) that is present inside of the p-type implantation area 113p to form Ga—O bond as shown in FIG. 10(c). Gallium atom (Ga) forming the Ga—O bond is more likely to migrate in the p-type implantation area 113p. This further increases the likelihood that gallium atom (Ga) migrates from the grid point to form a vacancy in the p-type implantation area 113p.

The first atmospheric gas may contain nitrogen ($N_2$), in addition to ammonia ($NH_3$). This nitrogen ($N_2$) suppresses release of nitrogen atom (N) from the surface of the p-type implantation area 113p and thereby suppresses the occurrence of n-type carrier (free electron) in the p-type implantation area 113p. In this application, the flow rate of ammonia ($NH_3$) is preferably not less than half the entire flow rate of the first atmospheric gas.

The first atmospheric gas may contain hydrogen ($H_2$), in addition to ammonia ($NH_3$). This further accelerates diffusion of magnesium atom (Mg) into the p-type implantation area 113p. In this application, the flow rate of ammonia ($NH_3$) is preferably not less than half the entire flow rate of the first atmospheric gas.

In terms of accelerating diffusion of the p-type impurity in the p-type implantation area 113p, the first temperature T1 is preferably not lower than 900° C. In terms of preventing surface damage of the p-type implantation area 113p, the first temperature T1 is preferably not higher than 1400° C. In terms of satisfying both acceleration of diffusion of the p-type impurity and prevention of surface damage, the first temperature T1 is more preferably not lower than 1050° C. and not higher than 1150° C.

In terms of satisfying both acceleration of diffusion of the p-type impurity and prevention of surface damage, the time period for which the semiconductor device 100d is kept at the first temperature T1 is preferably not shorter than 1 minute and not longer than 30 minutes.

Referring back to FIG. 4, after the first heating process (process P126), the manufacturer further processes the semiconductor device 100d by a second heating process (process P129). In the second heating process (process P129), the manufacturer heats the semiconductor device 100d at a second temperature T2 that is lower than the first temperature T1 in a second atmospheric gas including oxygen ($O_2$). According to this embodiment, the manufacturer supplies oxygen ($O_2$) at a flow rate of 2 slm while supplying nitrogen ($N_2$) at a flow rate of 100 slm into the furnace where the semiconductor device 100d is placed, so as to form the second atmospheric gas around the semiconductor device 100d. The manufacturer subsequently heats the semiconductor device 100d at the second temperature T2 set to 700°

C. in the second atmospheric gas. The manufacturer then keeps the semiconductor device 100d at the second temperature T2 for 5 minutes.

Figure 11:
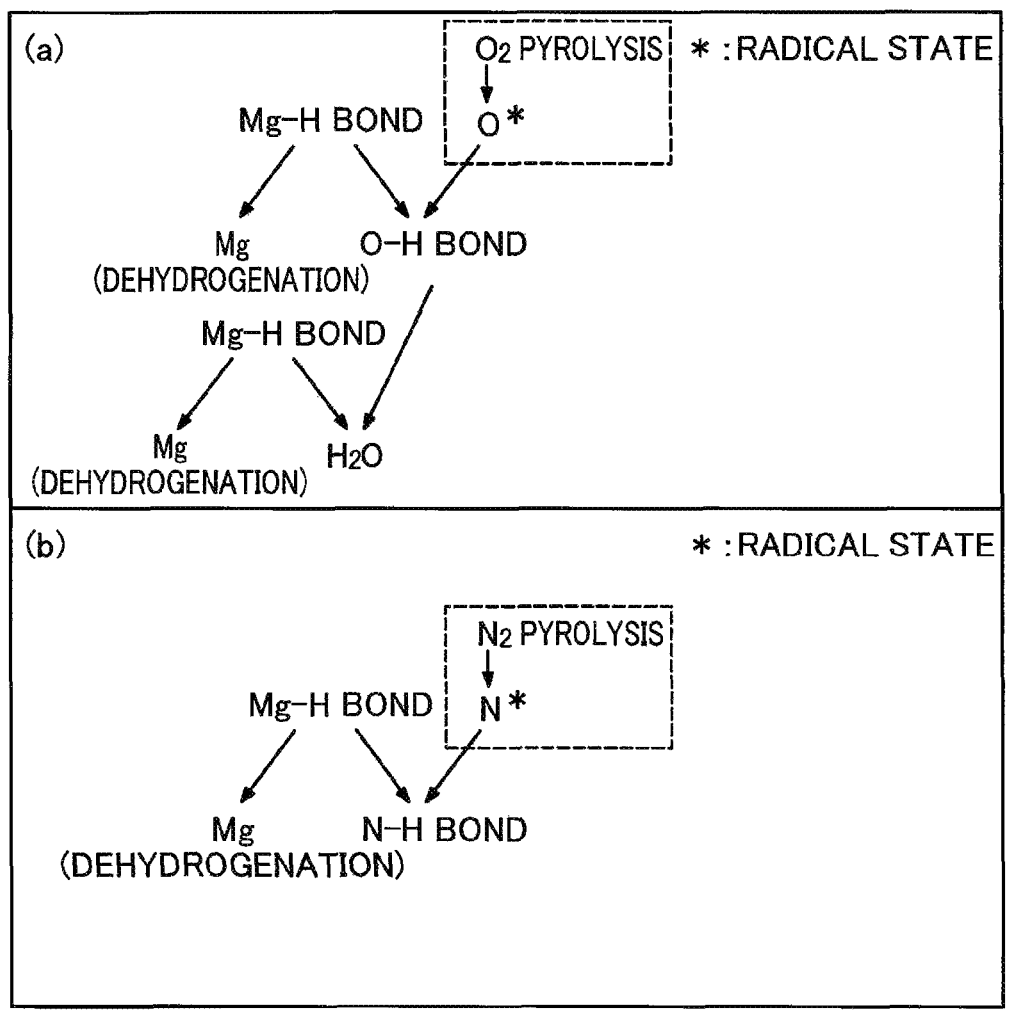
FIG. 11 is a diagram illustrating reactions proceeding in the p-type implantation area in the second heating process.

FIG. 11 is a diagram illustrating reactions proceeding in the p-type implantation area 113p in the second heating process (process P129). As shown in FIG. 11(a), in the second heating process (process P129), oxygen ($O_2$) included in the second atmospheric gas is pyrolyzed into O radical. The O radical produced from the second atmospheric gas reacts with the Mg—H bond that is present in the p-type implantation area 113p. This causes hydrogen atom (H) to be released from magnesium atom (Mg) (dehydrogenation reaction) and form O—H bond. This O—H bond combines with another Mg—H bond to further induce the dehydrogenation reaction.

As shown in FIG. 11(b), in the second heating process (process P129), nitrogen ($N_2$) included in the second atmospheric gas is pyrolyzed into N radical. The N radical produced from the second atmospheric gas reacts with Mg—H bond that is present in the p-type implantation area 113p. This causes hydrogen atom (H) to be released from magnesium atom (Mg) (dehydrogenation reaction) and form N—H bond. This N—H bond combines with another Mg—H bond to further induce the dehydrogenation reaction.

The reactions of FIGS. 11(a) and 11(b) decrease the hydrogen concentration on the surface of the p-type implantation area 113p to provide hydrogen concentration gradient in the p-type implantation area 113p. This hydrogen concentration gradient causes hydrogen atom (H) to migrate from inside to surface of the p-type implantation area 113p and thereby to be effectively released from magnesium atom (Mg). This accelerates fixation of magnesium atom (Mg) at the grid point of gallium atom (Ga).

The second atmospheric gas may include nitrogen ($N_2$) in addition to oxygen ($O_2$) or may not include nitrogen ($N_2$). In the case where the second atmospheric gas includes nitrogen ($N_2$), the flow rate of nitrogen ($N_2$) may be equal to or higher than the flow rate of oxygen ($O_2$) or may be lower than the flow rate of oxygen ($O_2$). In the case where nitrogen ($N_2$) is included in the second atmospheric gas, nitrogen ($N_2$) suppresses release of nitrogen atom (N) from the surface of the p-type implantation area 113p and thereby suppresses the occurrence of n-type carrier (free electron) in the p-type implantation area 113p.

In terms of accelerating release of hydrogen atom (H) from the p-type impurity, the second temperature T2 is preferably not lower than 500° C. In terms of preventing surface damage of the p-type implantation area 113p, the second temperature T2 is preferably not higher than 800° C.

In terms of satisfying both acceleration of fixation of the p-type impurity and prevention of surface damage, the time period for which the semiconductor device 100d is heated at the second temperature T2 is not shorter than 1 minute and not longer than 15 minutes.

The manufacturer obtains a semiconductor device 100e including the p-type semiconductor area 113 as an intermediate product of the semiconductor device 100 (shown in FIG. 9) through the first heating process (process P126) and the second heating process (process P129).

Referring back to FIG. 3, after forming the p-type semiconductor area 113 (process P120), the manufacturer forms the p-type semiconductor layer 114 on the n-type semiconductor layer 112 and the p-type semiconductor area 113 (process P130). According to this embodiment, the manufacturer forms the p-type semiconductor layer 114 by metal organic chemical vapor deposition (MOCVD).

After forming the p-type semiconductor layer 114 (process P130), the manufacturer forms the n-type semiconductor layer 116 on the p-type semiconductor layer 114 (process P140). According to this embodiment, the manufacturer forms the n-type semiconductor layer 116 by metal organic chemical vapor deposition (MOCVD).

After forming the n-type semiconductor layer 116 (process P140), the manufacturer forms the trench 122 and the recess 124 by etching (process P150). According to this embodiment, the manufacturer forms the trench 122 and the recess 124 by dry etching.

After forming the trench 122 and the recess 124 (process P150), the manufacturer forms the insulating film 130 (process P160). According to this embodiment, the manufacturer forms the insulating film 130 by atomic layer deposition (ALD).

After forming the insulating film 130 (process P160), the manufacturer forms the gate electrode 142, the body electrode 144, the source electrode 146 and the drain electrode 148 (process P170). The semiconductor device 100 is completed by the above series of processes.

A-4. Advantageous Effects

The configuration of the first embodiment described above performs the first heating process (process P126) to accelerate diffusion of the p-type impurity into the n-type semiconductor layer 112 and subsequently performs the second heating process (process P129) to accelerate fixation of the p-type impurity in the n-type semiconductor layer 112. This enables the gallium nitride (GaN)-based p-type semiconductor area 113 to be effectively formed by ion implantation.

The configuration of the first embodiment forms the through insulating film 912 on the n-type semiconductor layer 112 (process P121) and subsequently implants the p-type impurity across the through insulating film 912 into the n-type semiconductor layer 112 by ion implantation (process P123). The through insulating film 912 serves to adjust the distribution of the p-type impurity implanted into the n-type semiconductor layer 112. The through insulating film 912 also serves to suppress surface contamination of the n-type semiconductor layer 112 by ion implantation.

B. Second Embodiment

Figure 12:
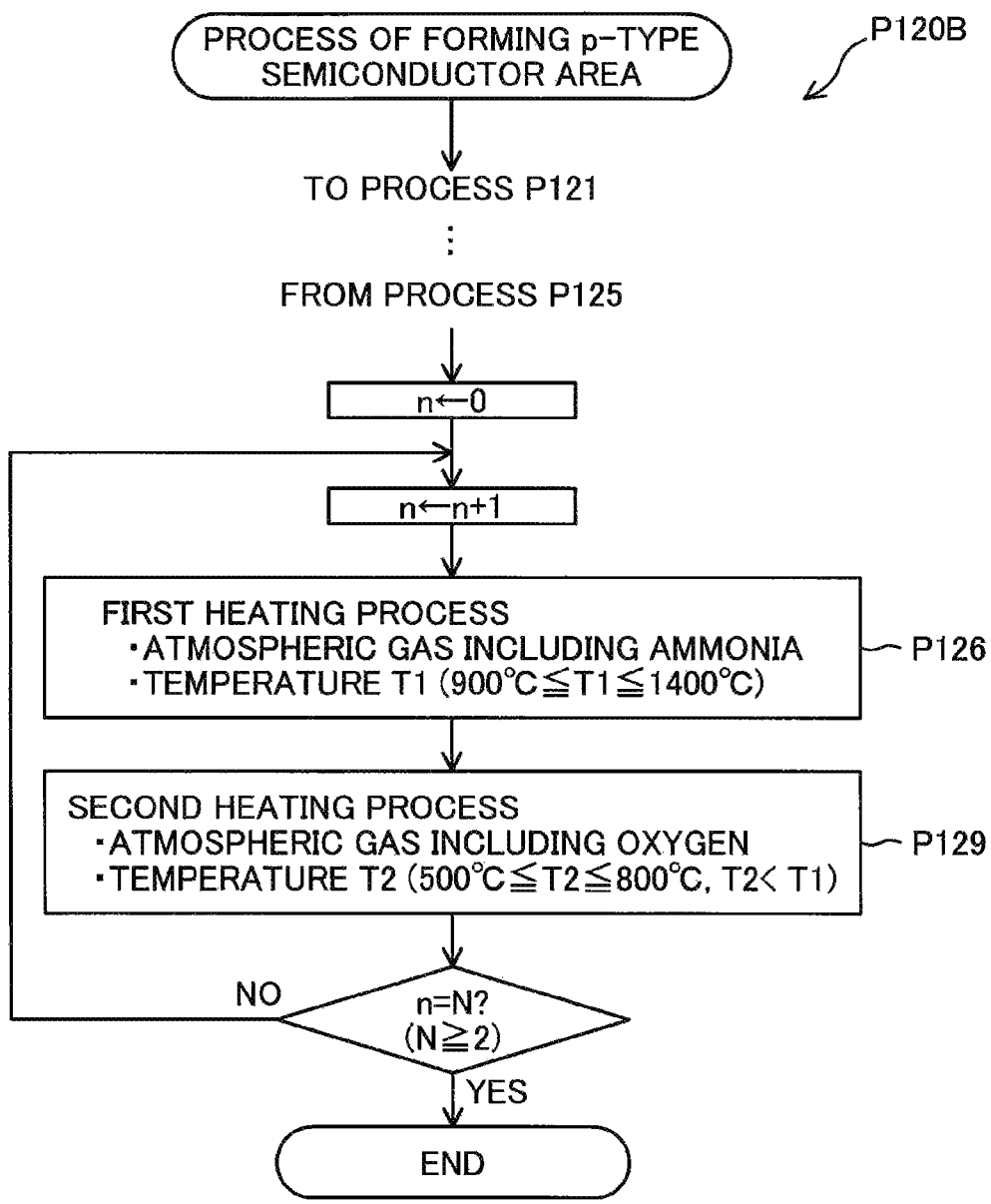
FIG. 12 is a process chart showing a process of forming the p-type semiconductor area according to a second embodiment.

FIG. 12 is a process chart showing a process of forming the p-type semiconductor area 113 (process P120B) according to a second embodiment. The second embodiment is similar to the first embodiment, except that the process of forming shown in FIG. 12 (process P120B) is performed in place of the process of forming shown in FIG. 4 (process P120). More specifically, the second embodiment is similar to the first embodiment, except that the series of the first heating process (process P126) and the subsequent second heating process (process P129) is repeated multiple number of times. The configuration of the second embodiment enables the gallium nitride (GaN)-based p-type semiconductor area 113 to be formed more effectively by ion implantation.

C. Third Embodiment

Figure 13:
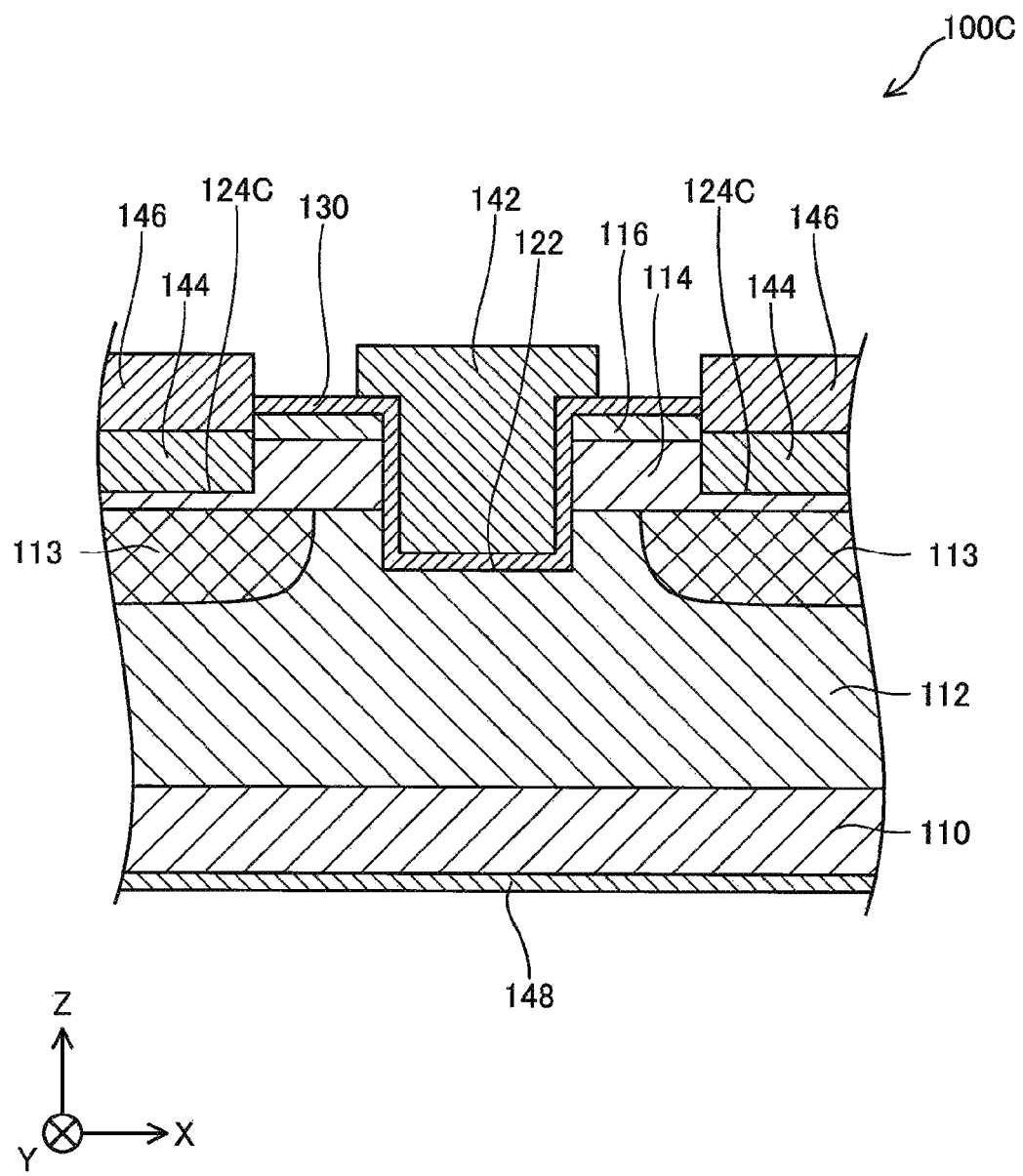
FIG. 13 is a sectional view schematically illustrating the configuration of a semiconductor device according to a third embodiment.

FIG. 13 is a sectional view schematically illustrating the configuration of a semiconductor device 100C according to a third embodiment. The semiconductor device 100C of the third embodiment has configuration similar to that of the semiconductor device 100 of the first embodiment, except that a recess 124C is provided in place of the recess 124 and that the relevant components are formed in different shapes according to the shape of the recess 124C. The recess 124C of the semiconductor device 100C is similar to the recess 124 of the first embodiment, except that the recess 124C is formed to a greater depth in the −Z-axis direction than the recess 124 of the first embodiment.

Figure 14:
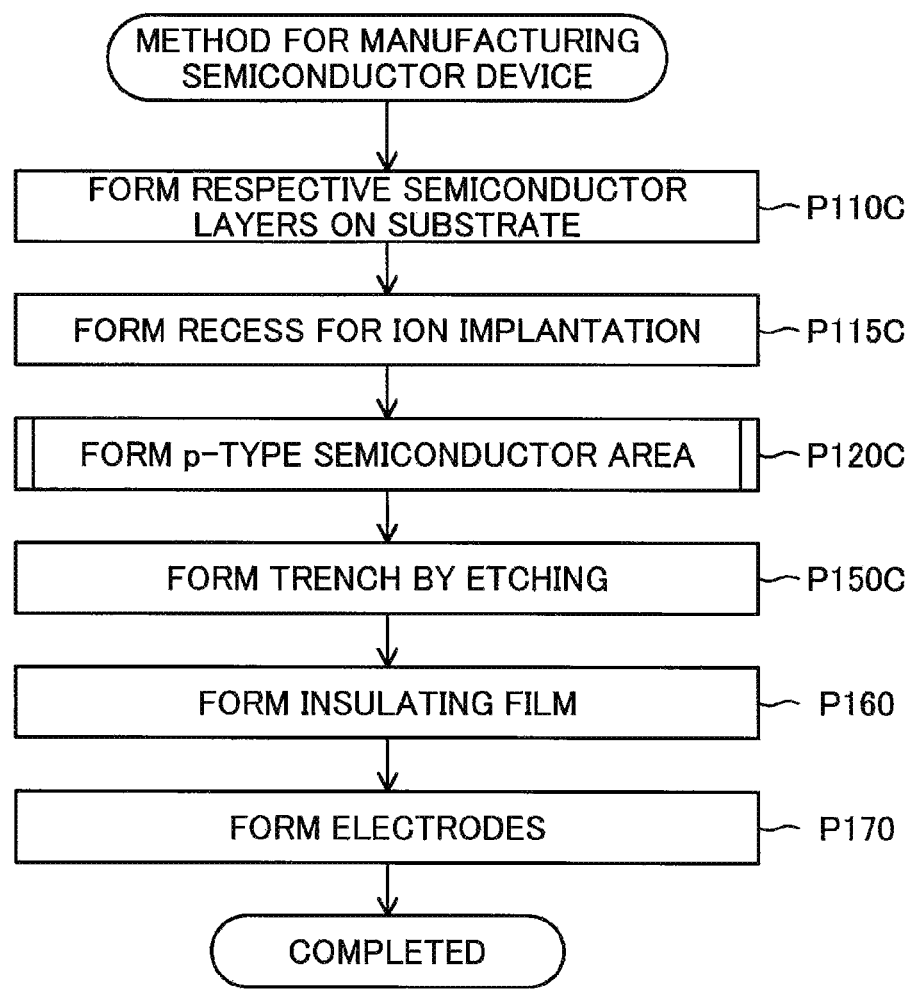
FIG. 14 is a process chart showing a method for manufacturing the semiconductor device according to the third embodiment.
Figure 15:
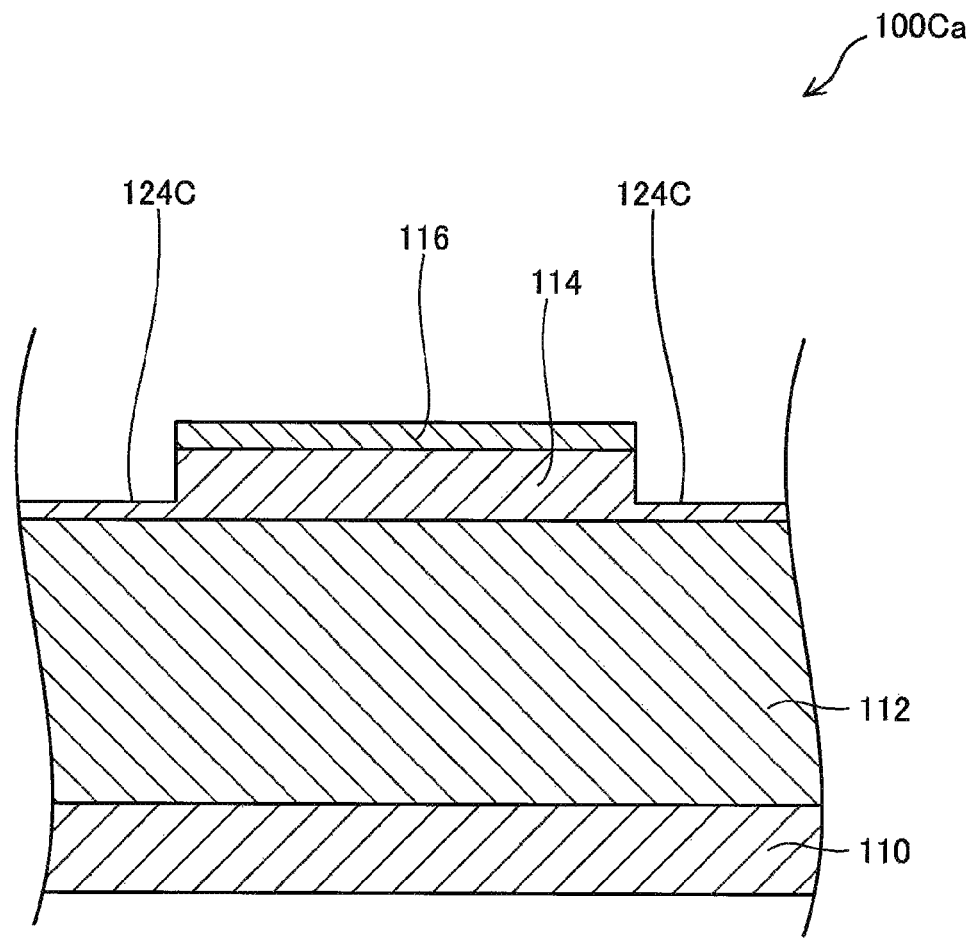
FIG. 15 is a diagram illustrating the processes of forming the p-type semiconductor area according to the third embodiment.
Figure 16:
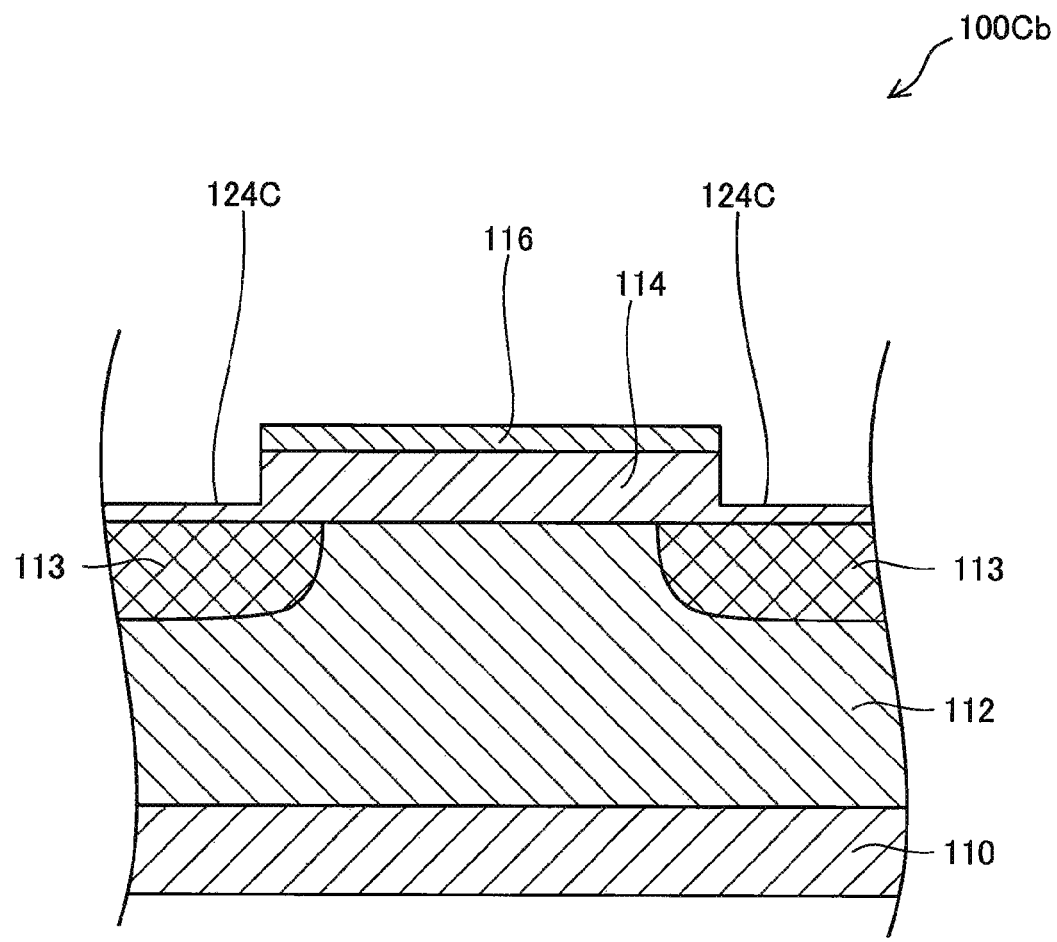
FIG. 16 is a diagram illustrating the processes of forming the p-type semiconductor area according to the third embodiment.

FIG. 14 is a process chart showing a method for manufacturing the semiconductor device 100C according to the third embodiment. FIGS. 15 and 16 are diagrams illustrating the processes of forming the p-type semiconductor area 113 according to the third embodiment.

The manufacturer first forms the n-type semiconductor layer 112, the p-type semiconductor layer 114 and the n-type semiconductor layer 116 on the substrate 110 by crystal growth (process P110C). According to this embodiment, the manufacturer first forms the n-type semiconductor layer 112 on the +Z-axis direction side surface of the substrate 110. The manufacturer subsequently forms the p-type semiconductor layer 114 on the +Z-axis direction side surface of the n-type semiconductor layer 112. The manufacturer then forms the n-type semiconductor layer 116 on the +Z-axis direction side surface of the p-type semiconductor layer 114. According to this embodiment, the manufacturer forms the n-type semiconductor layer 112, the p-type semiconductor layer 114 and the n-type semiconductor layer 116 by metal organic chemical vapor deposition (MOCVD).

After forming the respective semiconductor layers (process P110C), the manufacturer forms the recess 124C in the p-type semiconductor layer 114 and the n-type semiconductor layer 116 by etching (process P115C, FIG. 15). According to this embodiment, the manufacturer forms the recess 124C by dry etching. The manufacturer accordingly obtains a semiconductor device 100Ca including the recess 124C formed in the p-type semiconductor layer 114 and the n-type semiconductor layer 116 as an intermediate product of the semiconductor device 100C.

After forming the recess 124C (process P115C), the manufacturer forms the p-type semiconductor area 113 in part of the n-type semiconductor layer 112 by ion implantation (process P120C). The process of forming the p-type semiconductor area 113 (process P120C) according to this embodiment is similar to the process of forming the p-type semiconductor area 113 (process P120) according to the first embodiment, except that the processes of forming and removing the through insulating film 912 and the processes of forming and removing the ion implantation mask 914 (processes P121, P122, P124 and P125) are omitted and that the p-type impurity is implanted into the n-type semiconductor layer 112 through the p-type semiconductor layer 114 in the recess 124C. The manufacturer accordingly obtains a semiconductor device 100Cb including the p-type semiconductor area 113 formed below the recess 124C as an intermediate product of the semiconductor device 100C.

After forming the p-type semiconductor area 113 (process P120C), the manufacturer forms the trench 122 by etching (process P150C). According to this embodiment, the manufacturer forms the trench 122 by dry etching.

After forming the trench 122 (process P150C), the manufacturer forms the insulating film 130 (process P160), like the first embodiment. The manufacturer subsequently forms the gate electrode 142, the body electrode 144, the source electrode 146 and the drain electrode 148 (process P170), like the first embodiment. The semiconductor device 100C is completed by the above series of processes.

The configuration of the third embodiment enables the gallium nitride (GaN)-based p-type semiconductor area 113 to be formed effectively by ion implantation, like the first embodiment. This configuration also reduces the contact resistance between the p-type semiconductor area 113 by ion implantation and the p-type semiconductor layer 114 by crystal growth.

Compared with the configuration of the first embodiment that forms the p-type semiconductor layer 114 on the n-type semiconductor layer 112 by regrowth after ion implantation, the configuration of this embodiment prevents a potential trouble caused by contamination of the n-type impurity into the regrowth interface of the p-type semiconductor layer 114. This results in enhancing the breakdown voltage of the semiconductor device 100.

D. Other Embodiments

The invention is not limited to any of the embodiments, the examples and the modifications described above but may be implemented by a diversity of other configurations without departing from the scope of the invention. For example, the technical features of any of the embodiments, the examples and modifications corresponding to the technical features of each of the aspects described in Summary may be replaced or combined appropriately, in order to solve part or all of the problems described above or in order to achieve part or all of the advantageous effects described above. Any of the technical features may be omitted appropriately unless the technical feature is described as essential herein.

The semiconductor device which the present invention is applied to is not limited to the vertical trench MOSFET described in the above embodiments but may be any semiconductor device including a p-type semiconductor formed by ion implantation, for example, an insulated gate bipolar transistor (IGBT) or an MESFET (metal-semiconductor field effect transistor).

In the embodiments described above, the material of the substrate is not limited to gallium nitride (GaN) but may be any of silicon (Si), sapphire ($Al_2O_3$) and silicon carbide (SiC).

In the embodiments described above, the material of each semiconductor layer is not limited to gallium nitride (GaN) but may be any group III nitride (for example, aluminum nitride (AlN) or indium nitride (InN).

In the embodiments described above, the donor element contained in the n-type semiconductor layer is not limited to silicon (Si) but may be, for example, germanium (Ge) or oxygen (O).

In the embodiments described above, the acceptor element contained in the p-type semiconductor layer is not limited to magnesium (Mg) but may be, for example, zinc (Zn) or carbon (C).

In the embodiments described above, the material of the insulating film 130 may be any material having electrical insulating properties, for example, at least one of silicon dioxide ($SiO_2$), silicon nitrides ($SiN_x$), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON). The insulating film 130 may have a single-layered structure or may have a two-layered or multi-layered structure. The technique employed to form the insulating film 130 is not limited to ALD but may be another technique such as ECR sputtering or plasma CVD.

In the embodiments described above, the materials of the respective electrodes are not limited to the materials described above but may be other suitable materials.

In the embodiment described above, the process of removing the ion implantation mask 914 (process P124)

may be performed after the first heating process (process P126). In terms of facilitating removal of the through insulating film 912, however, it is preferable to perform the first heating process (process P126) subsequent to removal of the ion implantation mask 914 (process P124) as described in the above embodiment.

The invention claimed is:

1. A method for manufacturing a semiconductor device, the method comprising:
    an ion implantation of implanting a p-type impurity into a semiconductor layer mainly comprising a group III nitride;
    a first heating of the semiconductor layer at a first temperature in a first atmospheric gas including ammonia ($NH_3$), after the ion implantation;
    a second heating of the semiconductor layer, after the first heating, at a second temperature that is lower than the first temperature in a second atmospheric gas including oxygen ($O_2$),
        wherein the second heating heats the semiconductor layer after the first heating at the second temperature in the second atmospheric gas for a time period that is not shorter than 1 minute and not longer than 15 minutes; and
    forming a through insulating film on the semiconductor layer and forming an ion implantation mask on the through insulating film, prior to the ion implantation,
    wherein the ion implantation implants the p-type impurity across the through insulating film into the semiconductor layer.

2. The method for manufacturing the semiconductor device according to claim 1, wherein the second atmospheric gas includes nitrogen ($N_2$) and oxygen ($O_2$).

3. The method for manufacturing the semiconductor device according to claim 1, wherein the second temperature is not lower than 500° C. and not higher than 800° C.

4. The method for manufacturing the semiconductor device according to claim 1, wherein the first temperature is not lower than 900° C. and not higher than 1400° C.

5. The method for manufacturing the semiconductor device according to claim 1, wherein the ion implantation implants at least one of magnesium atom (Mg) and beryllium atom (Be) as the p-type impurity into the semiconductor layer.

6. The method for manufacturing the semiconductor device according to claim 1, wherein the ion implantation implants an oxygen atom (O) simultaneously with the p-type impurity into the semiconductor layer.

7. The method for manufacturing the semiconductor device according to claim 1, wherein the first atmospheric gas includes ammonia ($NH_3$) and nitrogen ($N_2$).

8. The method for manufacturing the semiconductor device according to claim 1, wherein the first atmospheric gas includes ammonia ($NH_3$) and hydrogen ($H_2$).

9. The method for manufacturing the semiconductor device according to claim 1, wherein the first heating heats the semiconductor layer after implantation of the p-type impurity at the first temperature in the first atmospheric gas for a time period that is not shorter than 1 minute and not longer than 30 minutes.

10. The method for manufacturing the semiconductor device according to claim 1, wherein, in the method, a series of the first heating and a subsequent second heating are repeated a multiple number of times.

11. The method for manufacturing the semiconductor device according to claim 1, further comprising:
    forming a p-type semiconductor layer on the semiconductor layer by a crystal growth, prior to the ion implantation,
    wherein the ion implantation implants the p-type impurity through the p-type semiconductor layer into the semiconductor layer.

12. The method for manufacturing the semiconductor device according to claim 1, wherein the ion implantation comprises disposing the ion implantation mask on the semiconductor layer, and implanting the p-type impurity into the semiconductor layer in a direction that the ion implantation mask is disposed on the semiconductor layer.

13. The method for manufacturing the semiconductor device according to claim 12, wherein the ion implantation further comprises implanting oxygen atoms simultaneously with the p-type impurity into the semiconductor layer.

* * * * *